United States Patent
Li

(10) Patent No.: US 9,318,545 B2
(45) Date of Patent: Apr. 19, 2016

(54) RESISTOR STRUCTURE AND METHOD FOR FORMING THE SAME

(71) Applicant: Shanghai Huahong Grace Semiconductor Manufacturing Corporation, Shanghai (CN)

(72) Inventor: Po Li, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 14/584,293

(22) Filed: Dec. 29, 2014

(65) Prior Publication Data

US 2015/0255532 A1  Sep. 10, 2015

(30) Foreign Application Priority Data

Mar. 7, 2014  (CN) .......................... 2014 1 0084279

(51) Int. Cl.
*H01L 49/02* (2006.01)
*H01L 23/522* (2006.01)

(52) U.S. Cl.
CPC ............ *H01L 28/20* (2013.01); *H01L 23/5223* (2013.01); *H01L 23/5228* (2013.01); *H01L 28/24* (2013.01); *H01L 28/40* (2013.01); *H01L 28/60* (2013.01)

(58) Field of Classification Search
CPC . H01L 23/5228; H01L 23/5223; H01L 28/40; H01L 28/24; H01L 28/20; H01L 21/28079; H01L 21/28008; H01L 28/60
See application file for complete search history.

(56) References Cited

U.S. PATENT DOCUMENTS

2008/0233704 A1* 9/2008 Fechner et al. ............... 438/381

FOREIGN PATENT DOCUMENTS

CN 102610660 A 7/2012
CN 103346067 A 10/2013

OTHER PUBLICATIONS

CN103346067-English Translation.*
First Chinese Office Action regarding Application No. 201410084279.6 dated Feb. 2, 2016. English translation provided by Unitalen Attorneys at Law.

* cited by examiner

*Primary Examiner* — Jose R Diaz
(74) *Attorney, Agent, or Firm* — Harness, Dickey & Pierce, P.L.C.

(57) ABSTRACT

A metal resistor structure and a method for forming the same are provided. The method includes: providing a substrate including a first and a second metallic plugs disposed in a first and a second regions respectively; forming a first metallic layer on the substrate; forming an insulating material layer on the first metallic layer; patterning the insulating material layer to form a first and a second insulating layer above the first and the second regions respectively; forming a second metallic layer overlaying exposed part of the first metallic layer, the first insulating layer, and the second insulating layer; forming a patterned mask layer on the second metallic layer; and etching, by using the patterned mask layer as a mask, until the substrate is exposed. Accordingly, a capacitor and a metallic resistor are formed on a set of steps, thus processing steps for forming the metallic resistor can be reduced.

10 Claims, 4 Drawing Sheets

RESISTOR STRUCTURE AND METHOD FOR FORMING THE SAME

CROSS-REFERENCE TO RELATED APPLICATIONS

The present application claims priority to Chinese patent application No. 201410084279.6, filed on Mar. 7, 2014, and entitled "RESISTOR STRUCTURE AND METHOD FOR FORMING THE SAME", the entire disclosure of which is incorporated herein by reference.

TECHNICAL FIELD

The present disclosure generally relates to semiconductor technology, and more particularly, to a resistor structure and a method for forming a resistor structure.

BACKGROUND

Resistors can be used in semiconductor integrated circuits (ICs) for controlling resistances of electronic components in the ICs. Usually, in a semiconductor device, the resistor can be formed by a polycrystalline silicon layer or a doped active region. As semiconductor devices are demanded to be more integrated, components of the semiconductor devices are required to have better electrical performance. However, the performance of poly resistor in terms of voltage coefficient and parasitic capacitance are bad due to material properties of the polycrystalline silicon and the close space to silicon substrate. As a result, in mixed signal or radio frequency ICs, metallic resistor replaces poly resistor due to its higher performance. In exiting forming methods, the metallic resistor is formed by independent photo exposure and etching processes, which increases the process and product manufacturing cost.

Existing metallic resistors are formed by implementing a photoetching or other etching processes to a metallic layer, so as to form a patterned metallic layer. Thereafter, a metallic interconnection structure can be formed on the metallic resistor, so as to connect the metallic resistor to other components formed on the metallic interconnection. The metallic interconnection structure can be formed by: forming a plurality of through-holes on a surface of the metallic resistor by photoetching or other etching processes; and filling up the through-holes with metal.

In existing methods for forming a semiconductor device including a metallic resistor, the photoetching or other etching processes implemented to the metallic resistor is an independent process. Thus, more processing steps are needed and manufacturing cost is increased.

Accordingly, a metallic resistor structure is provided by the present disclosure to cure above recited deficiencies.

SUMMARY

The present disclosure provides a method for forming a resistor structure, which has fewer steps and lower manufacturing cost.

According to one embodiment of the present disclosure, a method for forming a resistor structure is provided, including:
providing a substrate having a first region and a second region, wherein the substrate includes a first metallic interconnection structure and a dielectric layer enclosing the metallic interconnection structure, the metallic interconnection structure includes a first metallic plug disposed in the first region and a second metallic plug disposed in the second region, wherein top surfaces of the first metallic plug, the second metallic plug and the dielectric layer are flush with each other;

forming a first metallic layer on the top surfaces of the first metallic plug, the second metallic plug and the dielectric layer which are flush with each other;

forming an insulating material layer on the first metallic layer;

patterning the insulating material layer to form a first insulating layer above the first region and a second insulating layer above the second region, wherein the first insulating layer and the second insulating layer are isolated from each other, such that the first metallic layer is partially exposed;

forming a second metallic layer overlaying exposed part of the first metallic layer, the first insulating layer, and the second insulating layer;

forming a patterned mask layer on the second metallic layer, wherein the patterned mask layer overlays a first portion of the second metallic layer disposed on the first insulating layer, and exposes a second portion of the second metallic layer disposed on the second insulating layer; and etching, by using the patterned mask layer as a mask, until the substrate is exposed, wherein the first portion of the second metallic layer covered by the patterned mask layer, the first insulating layer under the first portion of the second metallic layer, and a first portion of the first metallic layer covered by the first insulating layer, are remained after the etching and thereby constituting a capacitor on the first metallic plug, wherein the second portion of the second metallic layer exposed by the patterned mask layer are removed by the etching, and the etching further removes the exposed part of the first metallic layer which is disposed on the second region, thereby a second portion of the first metallic layer which is disposed on the second region and is covered by the second insulating layer constitutes a metallic resistor on the second metallic plug.

In some embodiments, the method further includes: forming a first adhesive layer on the exposed part of first metallic layer, the first insulating layer, and the second insulating layer, wherein the second metallic layer is formed on the adhesive layer. The first adhesive layer can enhance adhesions between the second metallic layer and adjacent layers formed underneath the second metallic layer.

In some embodiments, the method further includes: forming a second adhesive layer on the second metallic layer. The second adhesive layer can enhance adhesions between the second metallic layer and adjacent layers formed on the second metallic layer, i.e., the patterned mask layer.

In some embodiments, more than one second metallic plugs are formed on the second region, the second insulating layer exposes a third portion of the first metallic layer disposed on at least one of the second metallic plugs, and the patterned mask layer covers a third portion of the second metallic layer which is disposed on the third portion of the first metallic layer, such that the third portion of the second metallic layer and the third portion of the first metallic layer are remained after the etching and thereby constituting a second metallic interconnection structure connected with at least one of the second metallic plugs In some embodiments, material of the insulating material layer is selected such that thickness of the second insulating layer remains substantially unchanged during the etching. Therefore, the second insulating layer can be used as the mask when etching the first metallic layer. Further, the second insulating layer can serve as a protective layer for the metallic resistor formed.

In some embodiments, the first metallic layer includes at least one selected from a group consisting of titanium, tantalum, titanium nitride and titanium nitride.

In some embodiments, the first metallic layer has a thickness ranging from 200 angstrom to 2000 angstrom.

In some embodiments, the second metallic layer includes aluminum.

In some embodiments, the insulating material layer includes a silicon nitride or a silicon oxide.

In some embodiments, the insulating material layer has a thickness ranging from 300 angstrom to 2000 angstrom.

According to one embodiment of the present disclosure, a resistor structure is provided, including: a substrate, wherein the substrate includes a metallic interconnection structure and a dielectric layer enclosing the metallic interconnection structure, the interconnection structure includes a plurality of metallic plugs whose top surfaces are plush with a top surface of the dielectric layer; and a metallic resistor disposed on the substrate and connected with at least one of the metallic plugs.

Embodiments of the present disclosure may have advantages as follows.

In some embodiments, capacitor and resistor structures are formed by one etching process. Therefore, processing steps are reduced and manufacturing cost may be reduced.

In some embodiments, in the etching process, there may be also formed another metallic interconnection structure, which further reduces the steps and cost.

In some embodiments, the metallic resistor and the lower plate of the capacitor are formed on the same layer. Since the capacitor is usually formed far away from the semiconductor substrate, the metallic resistor may be far away from the semiconductor substrate as well. Therefore, a stray capacitance generated between the metallic layer and the substrate can be reduced.

DETAILED DESCRIPTION

In order to clarify the objects, characteristics and advantages of the present disclosure, embodiments of the present disclosure will be described in detail in conjunction with the accompanying drawings. The disclosure will be described with reference to certain embodiments. Accordingly, the present disclosure is not limited to the embodiments disclosed. It will be understood by those skilled in the art that various changes may be made without departing from the spirit or scope of the disclosure.

Referring to FIG. 1 to FIG. 7, a method for forming a semiconductor device is illustrated. The method includes follow steps.

Figure 1:
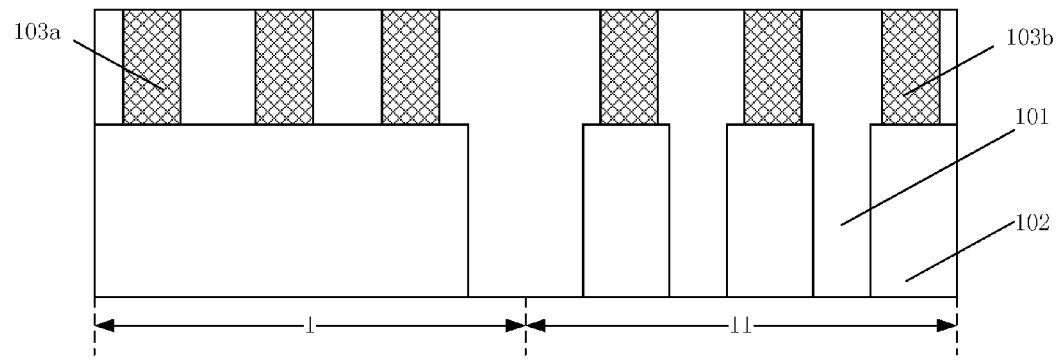
FIGS. 1 to 7 schematically illustrate cross-sectional views of intermediate structures formed in a process for forming a semiconductor structure according to one embodiment of the present disclosure.

S1, referring to FIG. 1, providing a substrate.

The substrate includes a metallic interconnection structure and a dielectric layer 101 enclosing the metallic interconnection structure. The metallic interconnection structure includes a first metallic plug 103a and a second metallic plug 103b. Furthermore, the substrate has a first region I and a second region II, wherein the first metallic plug 103a is disposed in the first region I and the second metallic plug 103b is disposed in the second region II. Top surfaces of the first metallic plug 103a, the second metallic plug 103b, and the dielectric layer 101 are flush with each other.

It should be noted that, the first region I and the second region II are defined just for distinguishing, and should not be taken as limitations. In some embodiments, the first region I and the second region II may be an integrated structure.

In some embodiments, the metallic interconnection structure may further include a metallic interconnection layer 102 disposed underneath the first metallic plug 103a and the second metallic plug 103b.

In some embodiments, the substrate may be a semiconductor substrate including a pre-metal dielectric (PMD), or a semiconductor substrate including a number of components or metallic interconnection structures.

The dielectric layer 101 of the substrate may be made of a low-k material or an ultra-low-k material. The metallic interconnection structure may be made of aluminum or copper. The first metallic plug 103a and the second metallic plug 103b may be made of tungsten or copper.

In some embodiments, the metallic interconnection structure may be a multi-stack structure including a first titanium nitride layer, an aluminum layer disposed on the titanium nitride layer, and a second titanium nitride layer disposed on the aluminum layer.

In some embodiments, the dielectric layer 101 may include a first dielectric layer and second dielectric layer disposed on a surface of the first dielectric layer. The surface of the first dielectric layer and a surface of the metallic interconnection layer are on a same plane. The first dielectric layer can be formed by: overlaying the metallic interconnection layer with a first dielectric material; and implementing a planarization process to the first dielectric material. The second dielectric layer can be formed on the first dielectric layer and the metallic interconnection layer. The first metallic plug 103a and the second metallic plug 103b can be formed by: forming a plurality of holes in the second dielectric layer, wherein the holes are formed on the surface of the metallic interconnection layer; filling up the holes with a metallic material; and implementing the planarization process to the metallic material.

In should be noted that, in following processes, a capacitor can be formed on the first region I of the substrate, and a metallic resistor can be formed on the second region II of the substrate. The metallic interconnection layer 102 can be connected with a bottom plate of the capacitor through the first metallic plug 103a, and connected with the metallic resistor through the second metallic plug 103b.

Figure 2:
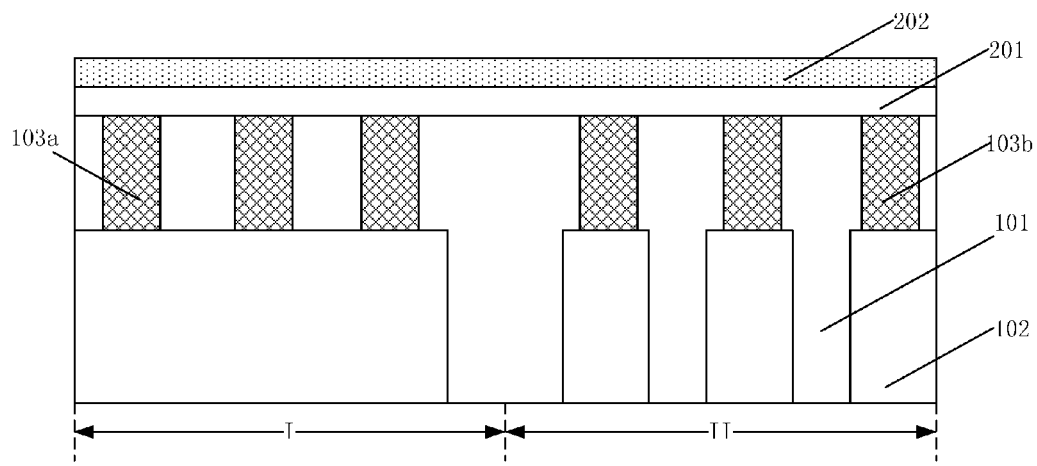

S2, referring to FIG. 2, forming a first metallic layer 201 on the top surfaces of the first metallic plug 103a, the second metallic plug 103b, and the dielectric layer 101 which are flush with each other; and forming an insulating material layer 202 on the first metallic layer 201.

The first metallic layer 201 may be made of titanium, tantalum, titanium nitride, tantalum nitride or any combinations thereof. The first metallic layer 201 may be formed by a physical vapor deposition (PVD) process or a chemical vapor deposition (CVD) process. The first metallic layer 201 may have a thickness ranging from 200 angstrom to 2000 angstrom.

The insulating material layer 202 may be made of silicon oxide or silicon nitride or other high-k dielectric. The insulating material layer 202 may be formed by a chemical vapor deposition (CVD) process or an atomic layer deposition (ALD) process. The insulating material layer 202 may have a thickness ranging from 100 angstrom to 2000 angstrom.

The insulating material layer 202 is formed both over the first region I and the second region II, the insulating material layer 202 formed over the first region I serves as a dielectric layer of a MIM (metal-insulator-metal) capacitor formed in the following processes, the insulating material layer 202 formed above the second region II serves as an etching barrier of the metallic resistor formed in the following processes.

Figure 3:
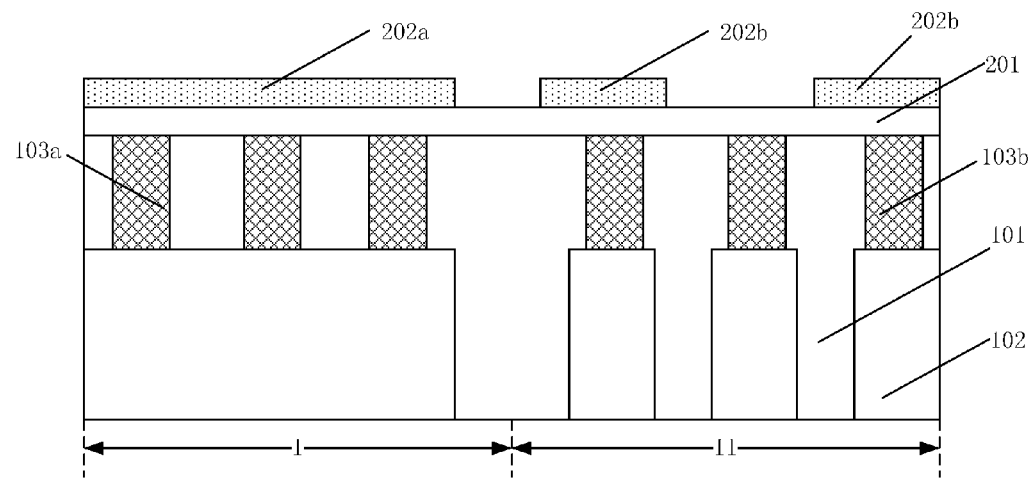

Referring to FIG. 3, patterning the insulating material layer 202, so as to form a first insulating layer 202a over the first region I and a second insulating layer 202b over the second region II, wherein the first insulating 202a and the second insulating layer 202b are isolated from each other.

Patterning the insulating material layer 202 may be implemented by: forming a patterned photoresist layer on the insulating material layer 202; etching the first insulating layer 202 by taking patterned photoresist layer as a mask, so as to expose a portion surface of the first metallic layer 201. Accordingly, remained insulating material layer over the first region I is the first insulating layer 202a, and remained insulating material layer over the second region II is the second insulating layer 202b.

The first insulating layer 202a serves as a dielectric layer of the capacitor formed in the following processes. The second insulating layer 202b serves as a protective layer for protecting the first metallic layer 201 disposed underneath the second insulating layer 202b, the first metallic layer 201 serves as the metallic resistor formed in the following processes.

In some embodiments, on the second region II, the second insulating layer 202b also exposes the first metallic layer 201 disposed on portion surface of the second metallic plug 103b.

Figure 4:
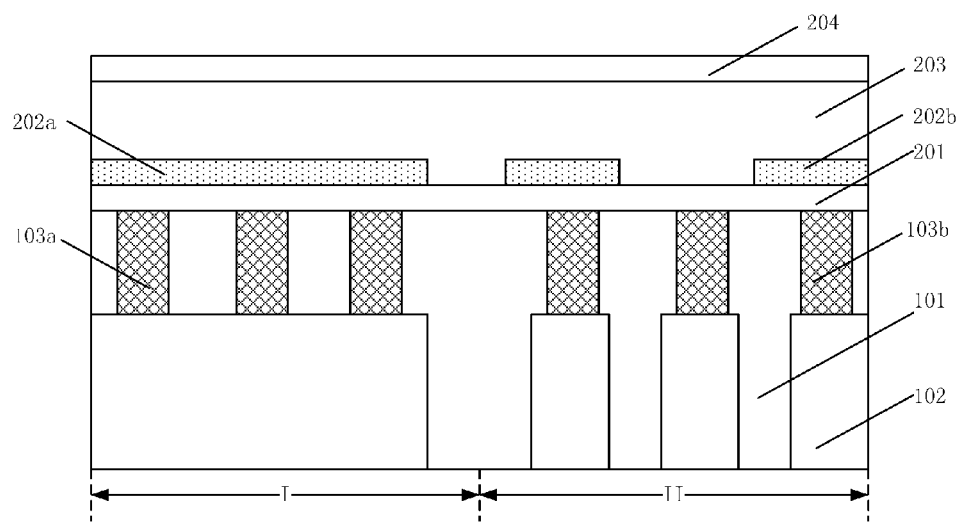

Referring to FIG. 4, forming a second metallic layer 203 overlaying exposed part of the first metallic layer 201a, the first insulating layer 202a and the second insulating layer 202b.

The second metallic layer 203 may be made of aluminum. The second metallic layer 203 may be formed by a PVD process, such as a sputtering process. The second metallic layer 203 may have a thickness ranging from 0.2 micrometer to 6 micrometer. According to specific requirement, the thickness of the second metallic layer 203 may be, for example, 0.3 micrometer, 1 micrometer, 1.5 micrometer, 2 micrometer, 2.5 micrometer, 3 micrometer, 3.5 micrometer 4 micrometer, 4.5 micrometer, 5 micrometer, 5.5 micrometer or 6 micrometer.

In some embodiments, the method may further include: forming a first adhesive layer on the exposed first metallic layer 201a, the first insulating layer 202a and the second insulating layer 202b. Thereafter, forming the second metallic layer 203 on the first adhesive layer. The first adhesive layer may be made of titanium, tantalum, titanium nitride, tantalum nitride or any combinations thereof. The first adhesive layer may be formed by the PVD process or the CVD process. The first adhesive layer may have a thickness ranging from 100 angstrom to 1000 angstrom. The first adhesive layer is used for improving an adhesive property between the second metallic layer 203 and the insulating material layer (specifically, the first insulating layer 202a and the second insulating layer 202b).

In some embodiments, the method may further include: forming a second adhesive layer 204 on the second metallic layer 203 after the second metallic layer 203 being formed. The second adhesive layer 204 may be made of titanium, tantalum, titanium nitride, tantalum nitride or any combinations thereof. The second adhesive layer 204 may be formed by the PVD process or the CVD process. The second adhesive layer 204 may have a thickness ranging from 100 angstrom to 1000 angstrom.

In some embodiments, the method may not include forming a second adhesive layer 204.

The first adhesive layer and the second adhesive layer 204 may have a higher adhesive, thus the adhesion force between the second metallic layer 203 and adjacent layers thereof may be improved. Therefore, quality of an interface between adjacent layers can be improved.

Figure 5:
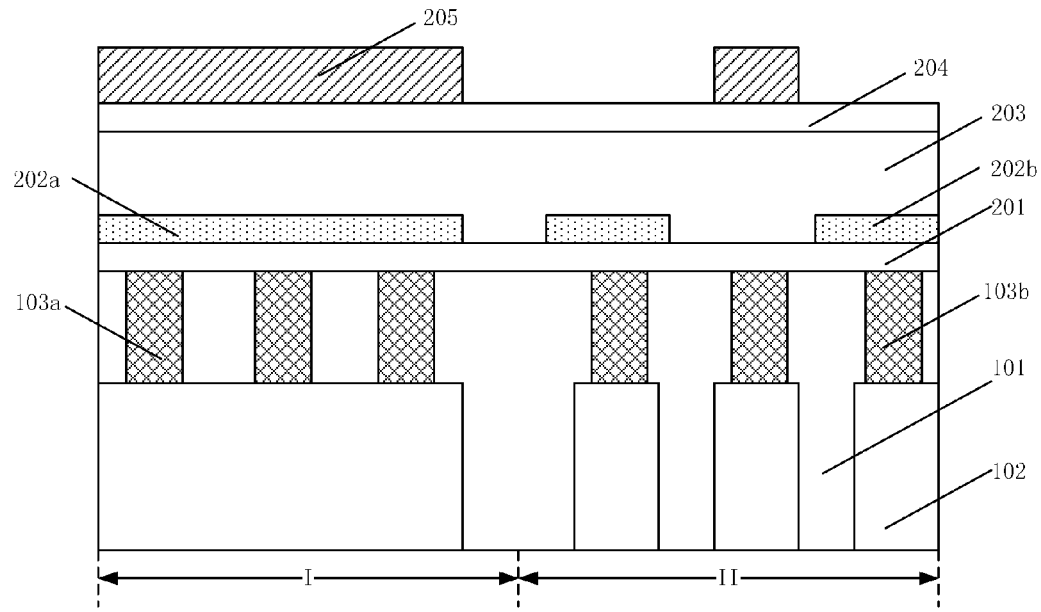

Referring to FIG. 5, forming a patterned mask layer 205 on the second metallic layer, wherein the patterned mask layer 205 overlays a first portion of the second metallic layer disposed over the first insulating layer 202a, and exposes a second portion of the second metallic layer disposed over the second insulating layer 202b.

In some embodiments, when the second adhesive layer 204 is disposed on the second metallic layer 203, the patterned mask layer 205 is directly formed on the second adhesive layer 204. In some embodiments, when there is no adhesive layer disposed on the second metallic layer 203, the patterned mask layer 205 is directly formed on the second metallic layer 203.

The patterned mask layer 205 formed on the first region I has a dimension identical to a dimension of the second insulating layer, and serves as a mask for forming the capacitor. The patterned mask layer 205 formed on the second region II serves as a mask for forming the metallic interconnection layer on the second region II.

The patterned mask layer 205 may be configured to a single-layer structure or a multi-layer structure. The patterned mask layer 205 may be made of photoresist. The patterned mask layer 205 may be formed by a spin coating process or an exposing process.

In some embodiments, when there is no second adhesive layer 204 disposed on the second metallic layer 203, on the second region II, the patterned mask layer 205 also overlays the second metallic layer disposed on the first metallic layer exposed by the second insulating layer 202b.

Figure 6:
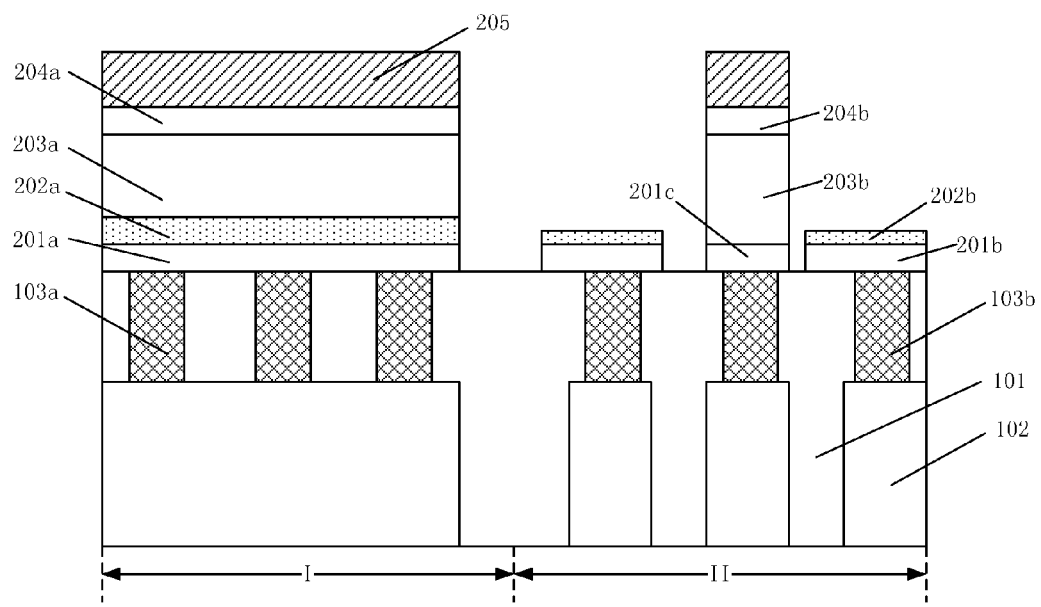

Referring to FIG. 6, etching the second metallic layer 203 (referring to FIG. 5), the first metallic layer 201 (referring to FIG. 5) by taking the patterned mask layer as a mask, so as to form a capacitor on the first region I; thereafter, etching the first metallic layer 201 by taking the exposed second insulating layer 202b as a mask, so as to form a metallic resistor on the second region II, wherein the first metallic layer 201 disposed underneath the second insulating layer 202b is not etched, and the metallic resistor is formed on the second metallic plug 103b.

In some embodiments, the etching may be a dry etching process. An etching gas of the dry etching process may be chlorine-based gas which may include at least one selected from a group consisting of $Cl_2$, HCl, $BCl_3$, $CCl_4$, and $SiCl_4$.

In some embodiment, the dry etching gas may include $Cl_2$, $BCl_3$, and $CHF_3$, wherein the $Cl_2$ has a flow rate ranging from 10 sccm to 100 sccm, the $BCl_3$ has a flow rate ranging from 10 sccm to 90 sccm, and the $CHF_3$ has a flow rate ranging from 1 sccm to 10 sccm. The dry etching process has an etching power ranging from 500 W to 1000 W. In some embodiment, the dry etching gas may include $Cl_2$, and $BCl_3$, wherein the $Cl_2$ has a flow rate ranging from 20 sccm to 1000 sccm, and the $BCl_3$ has a flow rate ranging from 20 sccm to 1000 sccm.

In some embodiments, the etching gas of the dry etching process may be fluoro-based gas which may include at least one selected from a group consisting of $CF_4$, $CFH_3$, and $C_3H_8$. It should be noted that, the second insulating layer 202b may became thinner, due to the etching process.

After the etching by taking the patterned mask layer 205 as a mask, the second insulating layer 202b on the second region II is exposed. An etching rate to the second insulating layer is far smaller than an etching rate to the second metallic layer 203 and the first metallic layer 201b, thus the second insulating layer 202b can serve as the mask for etching the first metallic layer 201b.

The dielectric layer 101 serves as an etching stopping layer, that is, the etching process will stop when reaching the dielectric layer 101. Therefore, the capacitor is formed on the first region I, the metallic resistor and the second metallic interconnection structure are formed on the second region II.

The capacitor formed includes: a portion of the first metallic layer 201a which serves as a lower plate; the first insulating layer which serves as a dielectric layer; the second metallic layer 203a which serves as an upper plate; and a portion of the second adhesive layer 204a disposed on the second metallic layer 203a.

The lower plate of the capacitor is connected with the metallic interconnection layer 102 through the first metallic plug 103a. The second adhesive layer 204a is used for improving the adhesion force between the second metallic layer 203a and an interlayer dielectric layer (not shown) formed in following processes. Further, the second adhesive can be used for preventing metallic atomics in the second metallic layer 203a from diffusing into the interlayer dielectric layer, and improving electromigration resistance of the second metallic layer 203a.

It should be noted that, in the present disclosure, "lower plate" and "upper plate" are only used for distinguishing two plates from each other, and are not a limitation to the position of the plates.

On the second region II, the first metallic layer 201b disposed underneath the second insulating layer 202b serves as the metallic resistor. The metallic resistor is connected with the metallic interconnection layer 102 through the second metallic plug 103b, thus the metallic resistor can be connected to other devices or interconnection structures through the metallic interconnection layer 102.

The second insulating layer 202b disposed on first metallic layer 201b can be used for protecting the metallic resistor. Even though the thickness of the second insulating layer 202b may be reduced in the etching process, it is larger enough to play the protecting role recited above, that is because the etching rate of the second insulating layer 202b is far smaller than that of the first metallic layer 201b.

In some embodiments, on the second region II, the second adhesive layer 204b, the second metallic layer 203b and the first metallic layer 201c which are disposed underneath the patterned mask layer 205 may serve as a second metallic interconnection structure, the metallic interconnection structure formed can be connected with the metallic interconnection layer 102 through the second metallic plug 103b.

In some embodiments, more than one second metallic plugs 103b may be formed on the second region II, and the second insulating layer 202b exposes a third portion of the first metallic layer 202a disposed on at least one of the second metallic plugs 103b, and the patterned mask layer covers a third portion of the second metallic layer 202b which is disposed on the third portion of the first metallic layer 202a, such that the third portion of the second metallic layer 202b and the third portion of the first metallic layer 202a are remained after the etching and thereby constituting the second metallic interconnection structure connected with at least one of the second metallic plugs 103b.

Figure 7:
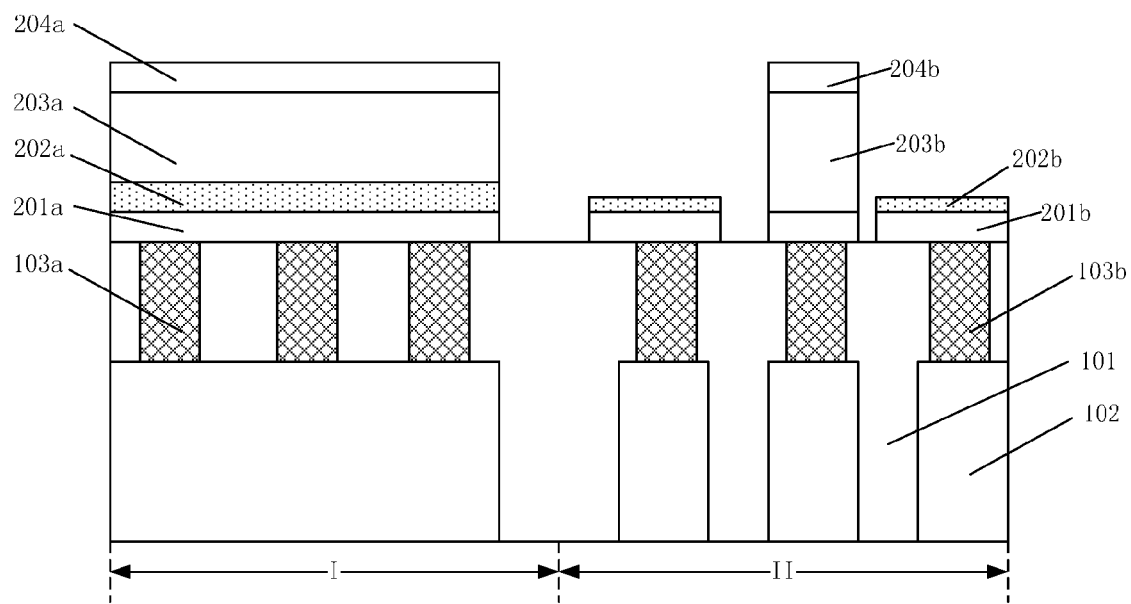

Referring to FIG. 7, removing the patterned mask layer 205 (as shown in FIG. 6).

The patterned mask layer 205 may be removed by an ashing process, a wet etching process, or other processes.

Thereafter, an interlayer dielectric layer may be formed on the exposed dielectric layer 101, wherein the interlayer dielectric layer may overlay the resistor, the metallic layer and the metallic interconnection structure. Furthermore, other metallic interconnection structures may be formed in the interlayer dielectric layer, which can be used for connecting the upper plate of the capacitor, the metallic or the metallic interconnection structure.

As recited above, the method according to one embodiment of the present disclosure includes: forming a first metallic layer on the substrate; forming an insulating material layer on the metallic layer; patterning the insulating material layer, so as to form a first insulating layer on the first region and a second insulating layer on the second region, wherein the first insulating layer serves as a dielectric layer of the capacitor formed in the following processes, the second insulating layer serves as a mask when etching the first metallic layer to form a metallic resistor.

The method further includes: forming a second metallic layer on the first insulating layer, the second insulating layer and the second metallic layer being exposed; forming a patterned mask layer on the second metallic layer, wherein the patterned mask layer overlays a portion of the second metallic layer disposed on the first insulating layer; etching the second metallic layer by taking the patterned mask layer as a mask, thus the second metallic layer underneath the patterned mask layer can be reserved to serve as an upper plate of the capacitor; etching the exposed first metallic layer until reach the dielectric layer underneath the first metallic layer, thus the first metallic layer underneath the first insulating layer and the first metallic layer underneath the second insulating layer are reserved, wherein the first metallic layer underneath the first insulating layer serves as a lower plate of the capacitor, and the first metallic layer underneath the second insulating layer serves as the metallic resistor. Accordingly, the resistor and the capacitor are formed through a same group of processes, thus processing steps and manufacturing cost of the metallic resistor can be reduced.

Furthermore, the metallic resistor and the lower plate of the capacitor are formed on the same layer, and the capacitor is usually formed far away from the semiconductor substrate, thus the metallic resistor is far away from the semiconductor substrate as well. Therefore, a stray capacitance generated between the metallic layer and the substrate may be reduced.

In addition, on the second region II, the patterned mask layer also overlays a portion of the second metallic layer on the first metallic layer which is not covered by the second insulating layer, and the patterned mask layer is taken as the mask of the etching, thus the first metallic layer and the second metallic layer underneath the patterned mask layer reserved can serve as a metallic interconnection structure. Accordingly, the metallic interconnection structure is formed in the same group of processes for forming the capacitor and the metallic resistor, thus processing steps and manufacturing cost can be further reduced.

According to one embodiment of the present disclosure, a resistor structure is provided. The resistor structure can be formed by the above recited method.

Referring to FIG. 7, the resistor structure includes: a substrate having a second region II, wherein the substrate includes a metallic interconnection structure and a dielectric layer 101 enclosing the metallic interconnection structure, the metallic interconnection structure includes a plurality of metallic plugs 103b whose top surfaces are plush with a top surface of the dielectric layer 101; and a metallic resistor disposed on the substrate and connected with at least one of the metallic plugs 103.

The substrate may further have a first region I. The metallic interconnection structure may further includes: a first metallic plug 103a disposed on the first region I, wherein the first metallic plug 103a, the second metallic plug 103b disposed on the second region II, and the dielectric layer 101 form the flat surface.

The first region I has a capacitor formed thereon, the capacitor includes: a first metallic layer 201a serves as a lower plate; a first insulating layer 202a disposed underneath the first metallic layer 201a, which serves as a dielectric layer; a second metallic layer 203a and a second adhesive layer 204a disposed on the first insulating layer, which serves as an upper plate of the capacitor.

The first metallic layer 201b can be connected to the metallic interconnection layer 102 through the second metallic plug 103b, thus the first metallic layer 201b can be connected to other semiconductor devices or interconnection structures. Further, a distance between the first metallic layer 201b and the substrate is large, thus stray capacitances generated between the metallic resistor and the substrate can be reduced.

Although the present disclosure has been disclosed above with reference to preferred embodiments thereof, it should be understood by those skilled in the art that various changes may be made without departing from the spirit or scope of the disclosure. Accordingly, the present disclosure is not limited to the embodiments disclosed.

What is claimed is:

1. A method for forming a metal resistor structure, comprising:
   providing a substrate having a first region and a second region, wherein the substrate includes a first metallic interconnection structure and a dielectric layer enclosing the metallic interconnection structure, the metallic interconnection structure includes a first metallic plug disposed in the first region and a second metallic plug disposed in the second region, wherein top surfaces of the first metallic plug, the second metallic plug and the dielectric layer are flush with each other;
   forming a first metallic layer on the top surfaces of the first metallic plug, the second metallic plug and the dielectric layer which are flush with each other;
   forming an insulating material layer on the first metallic layer;
   patterning the insulating material layer to form a first insulating layer above the first region and a second insulating layer above the second region, wherein the first insulating layer and the second insulating layer are isolated from each other, such that the first metallic layer is partially exposed;
   forming a second metallic layer overlaying exposed part of the first metallic layer, the first insulating layer, and the second insulating layer;
   forming a patterned mask layer on the second metallic layer, wherein the patterned mask layer overlays a first portion of the second metallic layer disposed on the first insulating layer, and exposes a second portion of the second metallic layer disposed on the second insulating layer; and
   etching, by using the patterned mask layer as a mask, until the substrate is exposed,
   wherein the first portion of the second metallic layer covered by the patterned mask layer, the first insulating layer under the first portion of the second metallic layer, and a first portion of the first metallic layer covered by the first insulating layer, are remained after the etching and thereby constituting a capacitor on the first metallic plug,
   wherein the second portion of the second metallic layer exposed by the patterned mask layer are removed by the etching, and the etching further removes the exposed part of the first metallic layer which is disposed on the second region, thereby a second portion of the first metallic layer which is disposed on the second region and is covered by the second insulating layer constitutes a metallic resistor on the second metallic plug.

2. The method according claim 1, further comprising: forming a first adhesive layer on the exposed part of the first metallic layer, the first insulating layer, and the second insulating layer, wherein the second metallic layer is formed on the adhesive layer.

3. The method according claim 1, further comprising: forming a second adhesive layer on the second metallic layer.

4. The method according claim 1, wherein more than one second metallic plugs are formed on the second region, the second insulating layer exposes a third portion of the first metallic layer disposed on at least one of the second metallic plugs, and the patterned mask layer covers a third portion of the second metallic layer which is disposed on the third portion of the first metallic layer, such that the third portion of the second metallic layer and the third portion of the first metallic layer are remained after the etching and thereby constituting a second metallic interconnection structure connected with at least one of the second metallic plugs.

5. The method according claim 1, wherein material of the insulating material layer is selected such that thickness of the second insulating layer remains substantially unchanged during the etching.

6. The method according to claim 1, wherein the first metallic layer comprises at least one selected from a group consisting of titanium, tantalum, titanium nitride and titanium nitride.

7. The method according to claim 1, wherein the first metallic layer has a thickness ranging from 200 angstrom to 2000 angstrom.

8. The method according claim 1, wherein the second metallic layer comprises aluminum.

9. The method according claim 1, wherein the insulating material layer comprises a silicon nitride or a silicon oxide.

10. The method according claim 1, wherein the insulating material layer has a thickness ranging from 300 angstrom to 2000 angstrom.

* * * * *